US011610933B2

(12) United States Patent
Lalanne et al.

(10) Patent No.: US 11,610,933 B2
(45) Date of Patent: *Mar. 21, 2023

(54) BACK-SIDE ILLUMINATED IMAGE SENSOR

(71) Applicant: STMicroelectronics (Crolles 2) SAS, Crolles (FR)

(72) Inventors: Frederic Lalanne, Bernin (FR); Laurent Gay, Lumbin (FR); Pascal Fonteneau, Theys (FR); Yann Henrion, Fontaine (FR); Francois Guyader, Montbonnot (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 14 days.

This patent is subject to a terminal disclaimer.

(21) Appl. No.: 17/327,364

(22) Filed: May 21, 2021

(65) Prior Publication Data
US 2021/0288102 A1 Sep. 16, 2021

Related U.S. Application Data

(62) Division of application No. 16/270,989, filed on Feb. 8, 2019, now Pat. No. 11,031,433.

(30) Foreign Application Priority Data

Feb. 13, 2018 (FR) ...................................... 1851203

(51) Int. Cl.
*H01L 27/146* (2006.01)
*H01L 21/768* (2006.01)
(Continued)

(52) U.S. Cl.
CPC .................. *H01L 27/14685* (2013.01); *H01L 21/76898* (2013.01); *H01L 27/1462* (2013.01);
(Continued)

(58) Field of Classification Search
CPC .......... H01L 27/14685; H01L 27/1464; H01L 27/1462; H01L 27/14636; H01L 27/14689;
(Continued)

(56) References Cited

U.S. PATENT DOCUMENTS

| 8,552,516 | B2 | 10/2013 | Murakoshi et al. |
| 9,209,320 | B1 | 12/2015 | Webster |
| 9,570,494 | B1 | 2/2017 | Jerome et al. |
| 11,031,433 | B2 * | 6/2021 | Lalanne .............. H01L 27/1463 |
| 11,398,521 | B2 * | 7/2022 | Gay .................. H01L 27/14683 |
| 2004/0108587 | A1 | 6/2004 | Chudzik et al. |

(Continued)

FOREIGN PATENT DOCUMENTS

| CN | 107507842 A | 12/2017 |
| FR | 2 974 237 A1 | 10/2012 |
| JP | H0897367 A | 4/1996 |

*Primary Examiner* — Jose R Diaz
(74) *Attorney, Agent, or Firm* — Seed Intellectual Property Law Group LLP

(57) ABSTRACT

Image sensors and methods of manufacturing image sensors are provided herein. In an embodiment, a method of manufacturing an image sensor includes forming a structure having a front side and a back side. The structure includes a semiconductor layer extending between the front side and the back side of the structure, and a capacitive insulation wall extending through the semiconductor layer between the front side and the back side of the structure. The capacitive insulation wall includes first and second insulating walls separated by a region of a conductive or semiconductor material. The method further includes selectively etching, from the back side of the structure, portions of the semiconductor layer and the region of conductive or semiconductor material, while retaining adjacent portions of the first and second insulating walls.

18 Claims, 3 Drawing Sheets

(51) Int. Cl.
*H01L 21/02* (2006.01)
*H01L 21/306* (2006.01)

(52) U.S. Cl.
CPC ...... *H01L 27/1463* (2013.01); *H01L 27/1464* (2013.01); *H01L 27/14636* (2013.01); *H01L 27/14689* (2013.01); *H01L 21/02238* (2013.01); *H01L 21/02252* (2013.01); *H01L 21/30625* (2013.01)

(58) Field of Classification Search
CPC .......... H01L 27/1463; H01L 21/30625; H01L 21/76898
See application file for complete search history.

(56) References Cited

U.S. PATENT DOCUMENTS

| | | |
|---|---|---|
| 2006/0001174 A1 | 1/2006 | Matsui |
| 2008/0113505 A1 | 5/2008 | Sparks et al. |
| 2008/0173993 A1 | 7/2008 | Andry et al. |
| 2009/0267183 A1 | 10/2009 | Temple et al. |
| 2010/0032808 A1 | 2/2010 | Ding et al. |
| 2010/0041203 A1 | 2/2010 | Collins et al. |
| 2010/0230806 A1 | 9/2010 | Huang et al. |
| 2010/0264544 A1 | 10/2010 | Heo et al. |
| 2012/0133010 A1 | 5/2012 | Komukai |
| 2012/0133021 A1 | 5/2012 | Joblot et al. |
| 2012/0261783 A1 | 10/2012 | Prima et al. |
| 2013/0105928 A1* | 5/2013 | Costello ............. H01L 27/1463 257/E31.119 |
| 2015/0279878 A1 | 10/2015 | Ahmed et al. |
| 2018/0012823 A1 | 1/2018 | Chen et al. |
| 2018/0166475 A1 | 6/2018 | Chen et al. |

\* cited by examiner

BACK-SIDE ILLUMINATED IMAGE SENSOR

BACKGROUND

Technical Field

The present disclosure concerns a back-side illuminated image sensor and a method of manufacturing such a sensor.

Description of the Related Art

A back-side illuminated image sensor conventionally comprises a semiconductor layer having a surface, called front surface, coated with a stack of insulating and conductive layers forming an interconnection structure, and having its surface opposite to the front surface, called back side, intended to receive an illumination originating from a scene, an image of which is desired to be acquired. The sensor comprises a plurality of pixels, for example, arranged in an array, formed inside and on top of the semiconductor layer. Each pixel particularly comprises a photodetection area formed in the semiconductor layer, and one or a plurality of control transistors formed inside and on top of the semiconductor layer, on the front side of the semiconductor layer. The pixels are interconnected via the interconnection structure.

BRIEF SUMMARY

In an embodiment, the present disclosure provides a method of manufacturing an image sensor that includes:

forming a structure having a front side and a back side, the structure including a semiconductor layer extending between the front side and the back side of the structure and a capacitive insulation wall extending through the semiconductor layer between the front side and the back side of the structure, the capacitive insulation wall including first and second insulating walls separated by a region of a conductive or semiconductor material; and selectively etching, from the back side of said structure, portions of the semiconductor layer and the region of conductive or semiconductor material, while retaining adjacent portions of the first and second insulating walls.

According to an embodiment, the method further includes depositing a passivation layer on the back side of the structure subsequent to the selectively etching.

According to an embodiment, the method includes performing an oxidation at the back side of the structure subsequent to the selectively etching.

According to an embodiment, the passivation layer is deposited by atomic layer deposition.

According to an embodiment, the passivation layer is made of a dielectric material having a dielectric constant greater than that of silicon oxide.

According to an embodiment, the semiconductor layer is made of single-crystal silicon, the region made of a conductive or semiconductor material is made of polysilicon, and the first and second insulating walls are made of silicon oxide.

According to an embodiment, the capacitive insulation wall includes a third insulating wall separating the region made of conductive or semiconductor material into two distinct walls.

According to an embodiment, the method further includes forming an interconnection layer on the front side of the structure.

According to an embodiment, forming the structure includes:

providing a substrate including the semiconductor layer, a surface of the semiconductor layer forming a front side of the substrate;

forming the capacitive insulation wall in the semiconductor layer from the front side of the substrate; and forming the back side of the structure by thinning a back side of the substrate to expose respective back sides of the semiconductor layer and of the capacitive insulation wall.

In another embodiment, the present disclosure provides an image sensor including a semiconductor layer having a first surface and a second surface opposite the first surface. A first insulation layer extends from the first surface of the semiconductor layer through the second surface of the semiconductor layer. A second insulation layer is spaced laterally apart from the first insulation layer, and the second insulation layer extends from the first surface of the semiconductor layer through the second surface of the semiconductor layer. A region of conductive or semiconductor material is between the first insulation layer and the second insulation layer.

According to an embodiment, the region of conductive or semiconductor material has a first surface that is substantially coplanar with the first surface of the semiconductor layer and a second surface that is substantially coplanar with the second surface of the semiconductor layer.

According to an embodiment, the image sensor further includes a passivation layer on the second surface of the semiconductor layer, the first and second insulation layers, and the region of conductive or semiconductor material.

The foregoing and other features and advantages will be discussed in detail in the following non-limiting description of specific embodiments in connection with the accompanying drawings.

DETAILED DESCRIPTION

Figure 1:
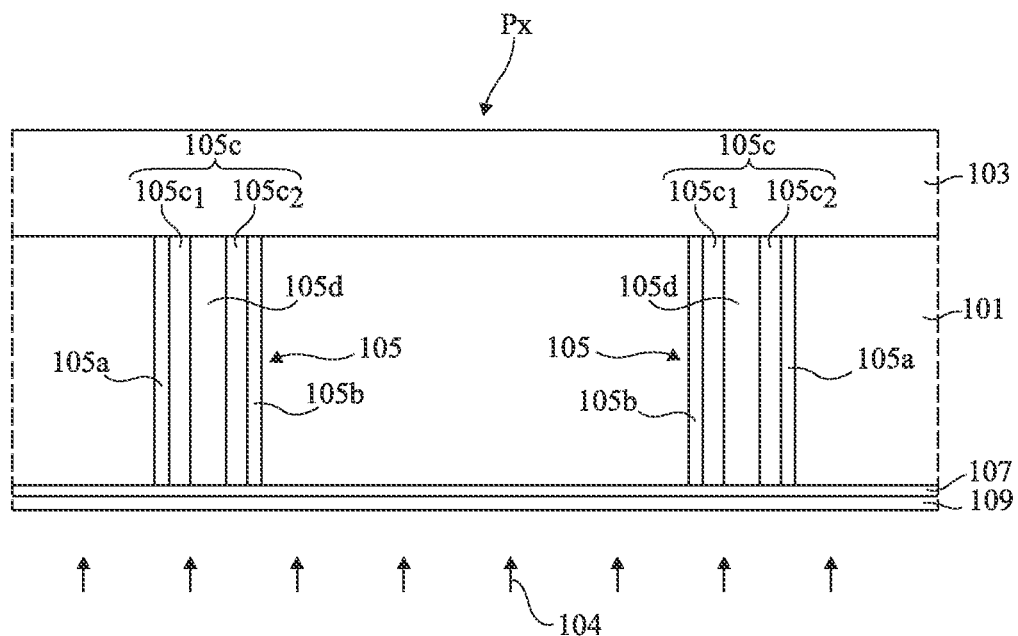
FIG. 1 is a cross-section view schematically and partially showing an example of back-side illuminated image sensor.

The same elements have been designated with the same reference numerals in the various drawings and, further, the various drawings are not to scale. For clarity, only those steps and elements which are useful to the understanding of the described embodiments have been shown and are detailed. In particular, the forming of the photodetection areas and of the transistors for controlling the pixels of the described sensors has not been detailed, the described embodiments being compatible with usual structures of pixels of back-side illuminated sensors. In the following description, when reference is made to terms qualifying absolute positions, such as "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described devices may be oriented differently. The terms "approximately", "substantially", and "in the order of" are used herein to designate a tolerance of plus or minus 10%, preferably of plus or minus 5%, of the value in question.

FIG. 1 is a partial simplified cross-section view of an example of a back-side illuminated image sensor. The sensor of FIG. 1 comprises a semiconductor layer 101, for example, made of single-crystal silicon. The sensor of FIG. 1 further comprises an interconnection structure 103 coating the upper surface or front side of semiconductor layer 101. The sensor of FIG. 1 comprises a plurality of pixels Px formed inside and on top of semiconductor layer 101. Each pixel Px comprises at least one photosensitive area (not detailed) formed in semiconductor layer 101, and one or a plurality of control transistors (not detailed) formed inside and on top of conductive layer 101. Pixels 101 are interconnected by conductive tracks (not detailed) formed in interconnection structure 103. In operation, the sensor is illuminated on its lower surface or back side, that is, on its side opposite to interconnection structure 103, as illustrated by arrows 104 of FIG. 1.

Sensors of the type illustrated in FIG. 1, comprising capacitive insulation walls 105 vertically extending through semiconductor layer 101, from the front side and to the back side of layer 101, are here more particularly considered. As an example, in each pixel, the photosensitive area of the pixel is totally surrounded, in top view, by a ring-shaped capacitive insulation wall 105. Each capacitive insulation wall 105 comprises two vertical insulating walls 105a and 105b, separated by a vertical conductive or semiconductor region 105c, for example, made of polysilicon. Regions 105a, 105b, and 105c for example each extend across the entire thickness of semiconductor layer 101, from the front side to the back side of layer 101. Each of insulating walls 105a and 105b has an outer lateral surface in contact with semiconductor layer 101 and an inner lateral surface in contact with region 105c. As an example, insulating walls 105a and 105b are made of silicon oxide. In the shown example, each capacitive insulation wall 105 further comprises a central insulating wall 105d, for example, made of silicon oxide, extending along the entire height of the insulation wall and separating conductive or semiconductor region 105c in two separate walls $105c_1$ and $105c_2$.

As an example, the thickness of semiconductor layer 101, and thus the height of walls 105, is in the range from 1 to 20 µm, for example, from 2 to 10 µm. Conductive or semiconductor regions $105c_1$ and $105c_2$ for example each have a width in the range from 10 to 100 nm, for example, in the order of 50 nm. Central insulating region 105d for example has a width in the range from 10 to 100 nm, for example, in the order of 50 nm. Outer insulating regions 105a and 105b for example each have a width in the range from 5 to 40 nm, for example, in the order of 15 nm.

In each capacitive insulation wall 105, conductive or semiconductor wall $105c_1$ and/or $105c_2$ of the insulation wall may be electrically connected, by its front side, to a terminal of application of a bias potential formed in interconnection structure 103, which enables to bias the capacitance formed between semiconductor layer 101 and wall $105c_1$ and/or the capacitance formed between semiconductor layer 101 and wall $105c_2$ during the sensor operation.

On the back side of the sensor, a passivation layer 107 made of a dielectric material, continuously extending over substantially the entire back side of the sensor, that is, on the back side of semiconductor layer 101 and on the back side of capacitive insulation walls 105, is provided. Layer 107 is for example made of a material different from the material of insulating walls 105a and 105b. As an example, layer 107 is made of a material having a strong dielectric constant, that is, having a dielectric constant greater than that of silicon oxide, for example, hafnium oxide ($HfO_2$) or aluminum oxide ($Al_2O_3$).

In the example of FIG. 1, the sensor further comprises an antireflection layer 109, for example, made of tantalum oxide ($Ta_2O_5$), coating the back side of passivation layer 107.

According to the needs of the application, other layers, not shown, may be provided on the back side of the sensor, for example, a silicon oxide protection layer, a filtering layer made of colored resin, a layer of microlenses, etc.

To form the sensor of FIG. 1, it may be started form a relatively thick initial substrate, for example, made of silicon, having its upper portion formed by semiconductor layer 101 of the sensor.

Pixels Px, capacitive insulation walls 105, and interconnection structure 103 are then formed inside and on top of semiconductor layer 101, from the front side of the substrate.

A support handle is then affixed onto the upper surface of interconnection structure 103, after which the substrate is thinned from its lower surface or back side, for example by grinding and/or by chemical thinning, possibly followed by a step of chemical-mechanical polishing (CMP), until the back side of semiconductor layer 101 and of capacitive insulation walls 105 is reached.

Passivation layer 107, as well as the possible additional back side layers of the sensor (antireflection layer 109 in the example of FIG. 1) are then deposited on the back side of semiconductor layer 101 and of capacitive insulation walls 105.

The support handle attached to the front side of interconnection structure 103 may then be removed. As a variation, the support handle may be kept as a mechanical support until the end of the method (and possibly in the final product).

In practice, it can be observed that the capacitance formed between conductive or semiconductor wall $105c_1$ and semiconductor layer 101 (separated by insulating wall 105a), and the capacitance formed between conductive or semiconductor wall $105c_2$ and semiconductor layer 101 (separated by insulating wall 105b) have relatively low breakdown voltages. As an example, when the thickness of insulating walls 105a and 105b is selected to obtain a theoretical breakdown voltage of 20 V between region $105c_1$ and region 101 and between region $105c_2$ and region 101, it can be observed, in practice, that the real breakdown voltage of the capacitances is approximately 10 V. Beyond this voltage, breakdowns are capable of occurring in walls 105a and 105b, in the vicinity of the lower surface of walls 105a and 105b.

A possible explanation of such a low breakdown voltage would be linked to the presence of defects at the interface between the lower surface of insulating walls 105a, 105b, and passivation layer 107, particularly resulting from the substrate thinning step preceding the deposition of layer 107.

Figure 2A:
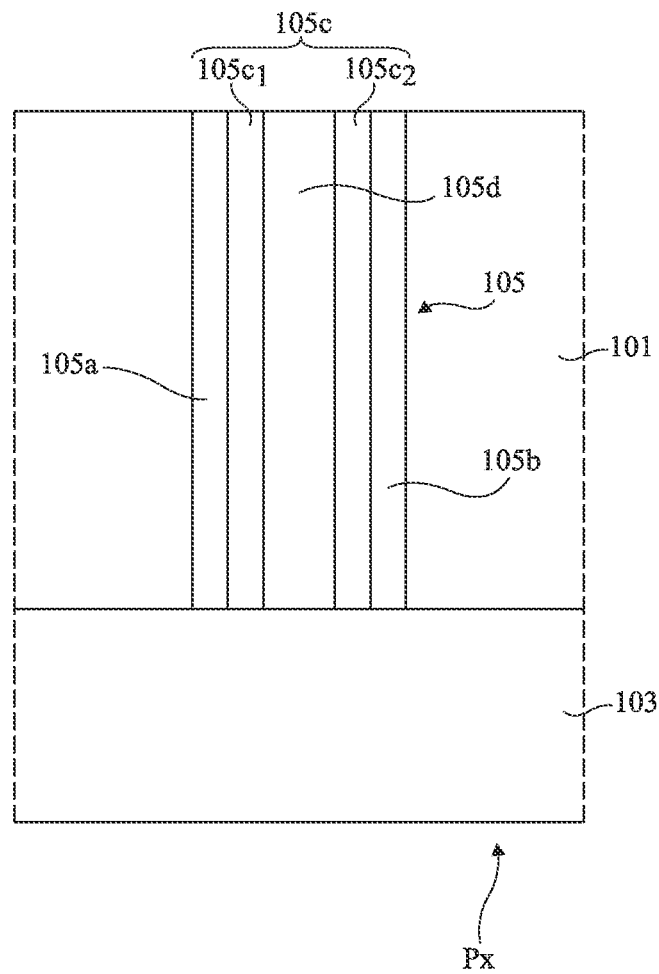
FIGS. 2A, 2B, and 2C are partial simplified cross section views illustrating an example of a method of manufacturing a back-side illuminated image sensor according to an embodiment.
Figure 2C:
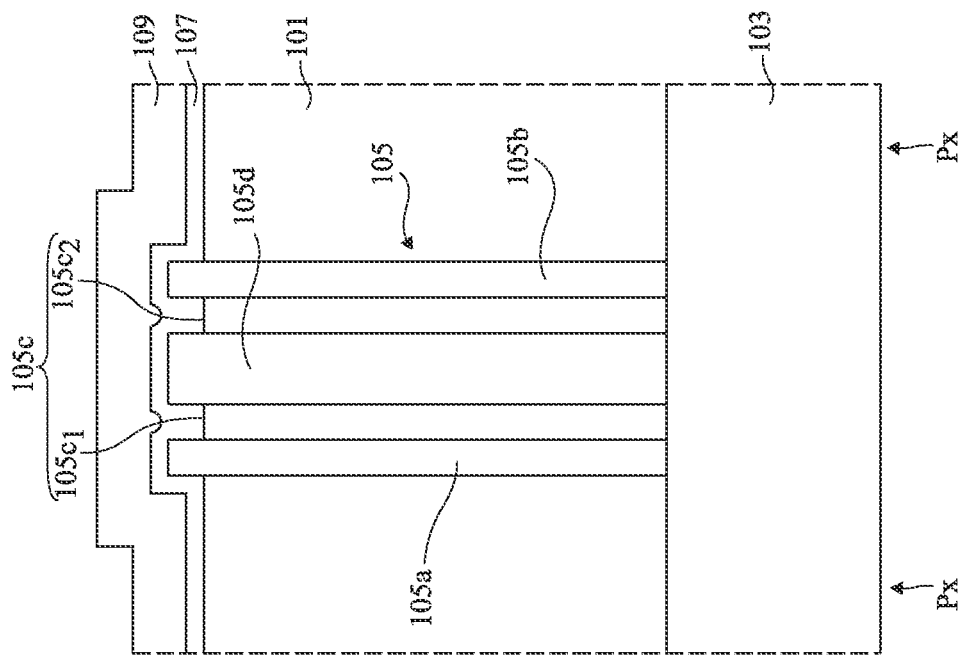
Figure 2B:
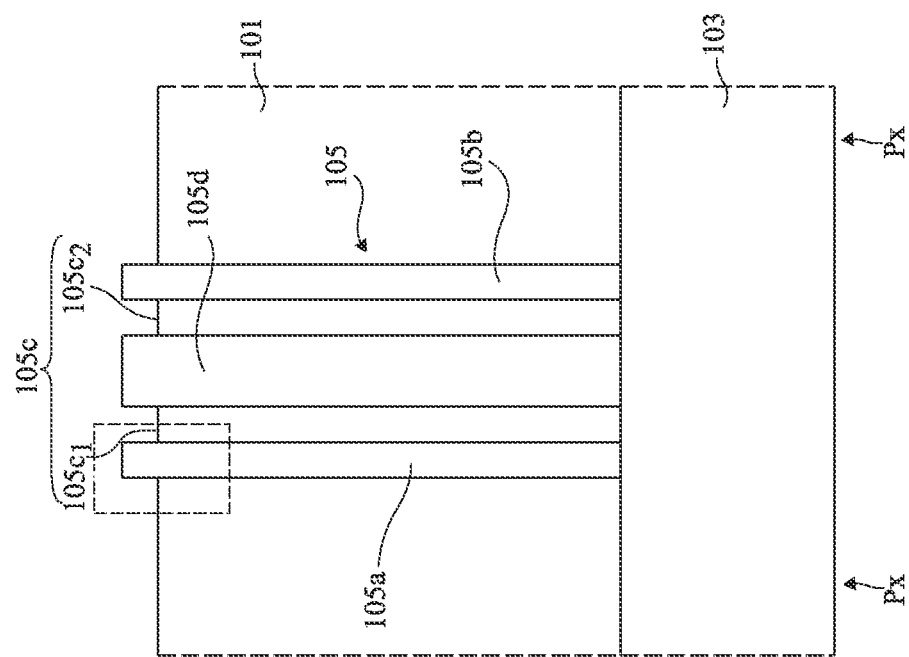

FIGS. 2A, 2B, and 2C are partial simplified cross section views illustrating successive steps of an example of a method of manufacturing a back-side illuminated image sensor according to an embodiment.

The sensor of FIGS. 2A, 2B, and 2C has common elements with the sensor of FIG. 1. These elements will not be described again. Hereafter, only the differences with the sensor of FIG. 1 will be highlighted. It should be noted that the cross-section views of FIGS. 2A, 2B, and 2C show an enlargement of a portion of the sensor, centered on a vertical capacitive insulation wall 105 of the sensor.

FIG. 2A illustrates an initial step of forming a structure comprising semiconductor layer 101 and capacitive insulation walls 105 extending vertically from the front side (lower surface in the orientation of FIGS. 2A, 2B, and 2C) to the back side (upper surface in the orientation of FIGS. 2A, 2B, and 2C) of semiconductor layer 101. To form this structure, one may, as in the previously-described example, start from a relatively thick initial substrate, for example, made of silicon, having its front portion formed by semiconductor layer 101. Pixels Px, capacitive insulation walls 105, and interconnection structure 103 are then formed inside and on top of semiconductor layer 101, from the front side of the substrate. A support handle (not shown) is then affixed to the front side of interconnection structure 103 (that is, the surface of interconnection structure 103 opposite to the substrate), after which the substrate is thinned from its back side, for example, by grinding, until the back side of semiconductor layer 101 and of capacitive insulation walls 105 is reached. The substrate thinning step may particularly comprise a step of chemical-mechanical planarization (CMP) which may obtain, after thinning, a substantially planar back side. In other words, at the end of this step, capacitive insulation walls 105 of the sensor are flush with the level of the back side of semiconductor 101 to form a substantially planar back side.

FIG. 2B illustrates a step of partial removal or recess of semiconductor layer 101 and of conductive or semiconductor regions 105c1 and $105c_2$, from the back side of the structure obtained at end of the steps of FIG. 2A. During this step, insulating regions 105a, 105b, and 105d of capacitive insulation walls 105 are kept. As an example, a partial etching of semiconductor layer 101 and of conductive or semiconductor regions $105c_1$ and $105c_2$, selective over insulating regions 105a, 105b, and 105d, is performed from the back side of the structure obtained at the end of the steps of FIG. 2A. Selective etching means that the etch speed of the material(s) forming layer 101 and regions $105c_1$ and $105c_2$ (for example, silicon) is greater, for example ten times greater, and preferably at least one hundred times greater, than the etch speed of the material(s) forming regions 105a, 105b and 105d (for example, silicon oxide). As an example, the etching implemented at the step of FIG. 2B is a plasma etching or a dry etching. As a variation, a wet etching may be used. The thickness of layer 101 and of regions $105c_1$ and $105c_2$ removed at the step of FIG. 2B is for example in the range from 5 to 200 nm, and preferably from 10 to 50 nm. As an example, the etching implemented at the step of FIG. 2B is a non-local etching, that is, semiconductor layer 101 and regions $105c_1$ and $105c_2$ are thinned across substantially the entire surface of the sensor.

Thus, at the end of the step of FIG. 2B, on the back side of the structure, conductive or semiconductor regions $105c_1$ and $105c_2$ of capacitive insulation walls 105 substantially stop at the same level as the back side of semiconductor layer 101. However insulating regions 105a, 105b, and 105d of walls 105 protrude from the back side of semiconductor layer 101.

At the end of the step of selective partial etching of layer 101 and of regions $105c_1$ and $105c_2$, a step of chemical cleaning of the back side of the sensor may be provided. During this step, a thin oxide layer (not shown), of native oxide or of chemical oxide, having a thickness in the order of 1 nm or less, may form on the back side of semiconductor layer 101 and on the back side of conductive and semiconductor regions $105c_1$ and $105c_2$.

FIG. 2C illustrates a step of deposition of passivation layer 107 of the sensor, on top of and in contact with the back side of the structure obtained at the end of the steps of FIGS. 2A and 2B. Layer 107 is for example deposited by atomic layer deposition (ALD). More generally, any other method of conformal deposition may be used, so that layer 107 follows the shape of the relief formed by the portions protruding from insulating walls 105a, 105b, and 105d of walls 105. Passivation layer 107 is for example continuously deposited all over the back side of the sensor.

FIG. 2C further illustrates a step of deposition of antireflection layer 109 on top of and in contact with the back side of passivation layer 107. As an example, layer 109 is deposited by atomic layer deposition (ALD). More generally, any other method of conformal deposition may be used. Antireflection layer 109 is for example continuously deposited all over the back side of the sensor.

As previously indicated, according to the needs of the application, other layers, not shown, may be provided on the back side of the sensor, for example, a silicon oxide protection layer, a filtering layer made of colored resin, a layer of microlenses, etc.

An advantage of the manufacturing method described in relation with FIGS. 2A, 2B, and 2C and of the sensor obtained by this method is a significant improvement of the voltage behavior of capacitive insulation walls 105. Such an improvement can particularly be explained by the increase of the electric path between semiconductor layer 101 and conductive or semiconductor region $105c_1$ or $105c_2$, via the interface between insulating walls 105A or 105B and passivation layer 107.

As an example, for identical dimensions, and particularly for a same thickness of insulating walls 105a and 105b of walls 105, an improvement by a factor two of the breakdown voltage of the capacitances formed between region $105c_1$ and layer 101 on the one hand, and between region $105c_2$ and layer 101 on the other hand, can be observed.

Figure 3A:
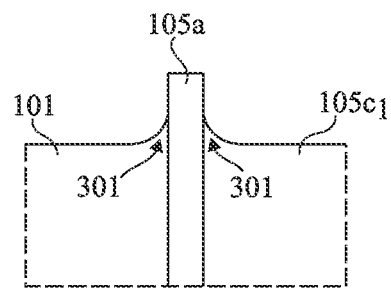
FIGS. 3A and 3B are partial simplified cross-section views illustrating an alternative embodiment of the method of FIGS. 2A, 2B, and 2C.
Figure 3B:
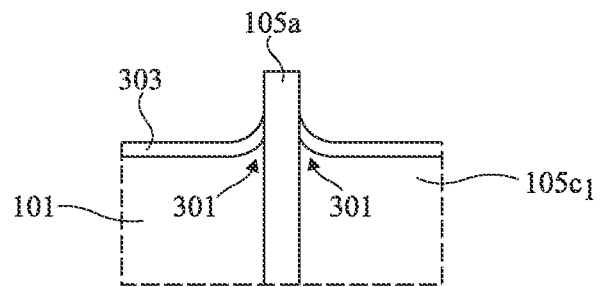

FIGS. 3A and 3B are partial simplified cross-section views illustrating an alternative embodiment of the method of FIGS. 2A, 2B, and 2C. FIGS. 3A and 3B more particularly show an enlargement of a portion of the sensor, in the vicinity of the back side of the sensor, at the level of an insulating wall 105a of a vertical capacitive insulation wall 105 of the sensor.

FIG. 3A shows the back side of the sensor at the end of the step of partial selective etching of layer 101 and of regions $105c_1$ and $105c_2$, described in relation with FIG. 2B. As appears in FIG. 3A, it can be observed that, in practice, the etching of layer 101 and of regions $105c_1$ and $105c_2$ is not perfectly uniform. More particularly, according to the type of method used for perform the etching, there may remain residues of the material of layer 101 and of regions $105c_1$ and $105c_2$ in the immediate vicinity of insulating walls 105a, 105b, and 105d, for example, due to a shadowing, selectivity, etc. effect. This results in the forming, in layer 101 and/or in regions $105c_1$ and $105c_2$, of point-shaped or bird's beak structures 301, bearing on insulating walls 105a, 105b, and 105c.

FIG. 3B illustrates a step of oxidation of the back side of the structure obtained at the end of the steps of FIGS. 2A and 2B, to form a relatively thick oxide layer 303, for example, in the range from 1 to 10 nm, for example, in the order of 5 nm, on the back side of semiconductor layer 101 and on the back side of regions $105c_1$ and $105c_2$ of capacitive insulation walls 105. As illustrated in FIG. 3B, this oxidation step results in significantly rounding, or even in suppressing, the points of bird's beak structures 301 at the interface with insulating walls 105a, 105b, and 105d. As an example, the oxidation step is carried out by submitting the back side of the sensor to an oxygen plasma, preferably at a temperature smaller than 400° C. to avoid damaging interconnection structure 103 of the sensor. As a variation, a chemical oxidation may be provided.

The rest of the method is for example identical or similar to what has been previously described in relation with FIG. 2C.

An advantage of the alternative embodiment of FIGS. 3A and 3B is that it enables to further improve the voltage behavior of the capacitive insulation walls of the sensor.

Figure 4:
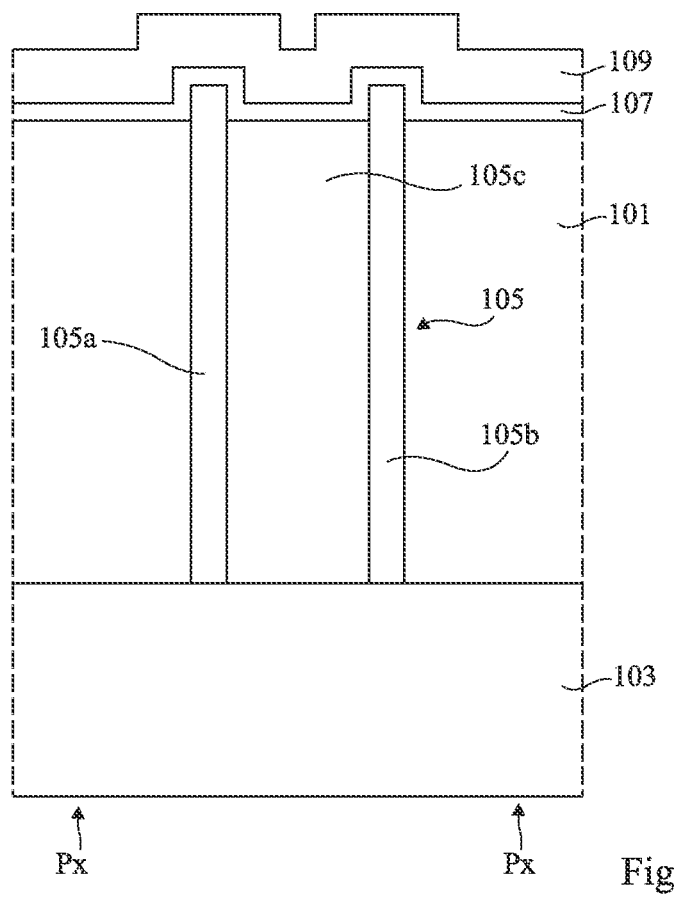
FIG. 4 is a partial simplified cross-section view illustrating another example of a back-side illuminated image sensor according to an embodiment.

FIG. 4 is a partial simplified cross-section view illustrating another example of a back-side illuminated image sensor according to an embodiment. FIG. 4 is a view in the same cross-section plane as FIG. 2C. The sensor of FIG. 4 has elements common with the sensor of FIG. 2C, and is formed by a manufacturing method similar to the method described in relation with FIGS. 2A, 2B, and 2C and, possibly, 3A and 3B. Hereafter, only the differences with respect to the sensor of FIG. 2C will be detailed. The sensor of FIG. 4 differs from the sensor of FIG. 2C mainly in that, in the example of FIG. 4, capacitive insulation walls 105 comprise no central insulating wall 105d. Thus, in the example of FIG. 4, regions $105c_1$ and $105c_2$ are combined in a single central conductive or semiconductor region 105c. In other words, each capacitive insulation wall 105 comprises two insulating walls 105a and 105b having their outer lateral surfaces in contact with semiconductor layer 101, and a conductive or semiconductor region 105c forming a single central wall having its lateral surfaces respectively in contact with the inner lateral surface of insulating wall 105a and with the inner lateral surface of insulating wall 105b.

Specific embodiments have been described. Various alterations, modifications, and improvements will readily occur to those skilled in the art. In particular, the above-described embodiments are not limited to the examples of numerical dimensions or to the examples of materials mentioned in the present disclosure.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a structure having a front side and a back side, the structure including a semiconductor layer extending between the front side and the back side of the structure and first and second insulating walls that extend from the front side to the back side and are separated by a conductive or semiconductor material;
   selectively etching, from the back side of the structure, portions of the semiconductor layer and the conductive or semiconductor material, a first end of the first insulating wall and a second end of the second insulating wall extending past the etched semiconductor layer and past the etched conductive or semiconductor material; and
   forming an oxidation layer on the semiconductor layer, on the first end, on the second end, and on the conductive or semiconductor material.

2. The method of claim 1, further comprising:
   forming a passivation layer on the back side of the structure subsequent to the selectively etching.

3. The method of claim 2, comprising:
   forming the oxidation layer at the back side of the structure subsequent to the selectively etching and prior to the depositing the passivation layer.

4. The method of claim 2, wherein the depositing the passivation layer includes depositing the passivation layer by atomic layer deposition.

5. The method of claim 2, wherein the passivation layer comprises a dielectric material having a dielectric constant greater than that of silicon oxide.

6. The method of claim 2, wherein the forming the passivation layer includes a conformal deposition.

7. The method of claim 1, wherein the semiconductor layer is a layer of single-crystal silicon, the conductive or semiconductor material is a polysilicon, and the first and second insulating walls are silicon oxide insulating walls.

8. The method of claim 1, wherein the structure includes a third insulating wall extending past the conductive or semiconductor material, the conductive or semiconductor material including first and second walls of the conductive or semiconductor material on opposite sides of the third insulating wall.

9. The method of claim 1, further comprising:
   forming an interconnection layer on the front side of the structure.

10. The method of claim 1, wherein forming the structure includes:
    forming a substrate including the semiconductor layer, a surface of the semiconductor layer is a front side of the substrate;
    forming the first and second insulation walls in the semiconductor layer from the front side of the substrate; and
    forming the back side of the structure by thinning a back side of the substrate to expose respective back sides of the semiconductor layer and the first and second insulation walls.

11. The method of claim 10, wherein conductive or semiconductor material is substantially coplanar with both the front side and the back side of the semiconductor layer after the etching portions of the semiconductor layer and the conductive or semiconductor material.

12. The method of claim 11, wherein the conductive or semiconductor material extends between and directly contacts the first and second insulating walls from the front side to the back side of the semiconductor layer.

13. A method, comprising:
    forming a capacitive insulation wall in a semiconductor layer having opposite first and second surfaces, the forming the capacitive insulation wall including:
        forming a first insulation wall extending between the first and second surfaces of the semiconductor layer, the first insulation wall extending past the second surface of the semiconductor layer;
        forming a second insulation wall extending between the first and second surfaces of the semiconductor layer, the second insulation wall spaced laterally apart from the first insulation wall, the second insulation wall extending past the second surface of the semiconductor layer; and forming a conductive or semiconductor region between the first and second insulation walls;

selectively removing portions of the semiconductor layer and the conductive or semiconductor region by etching the semiconductor layer and the conductive or semiconductor region from the second surface of the semiconductor layer, the conductive or semiconductor region is substantially coplanar with both the first and second surfaces of the semiconductor layer.

14. The method of claim 13, further comprising:

forming an oxide layer on the second surface of the semiconductor layer and on the conductive or semiconductor region.

15. The method of claim 13, further comprising:

forming a third insulating wall extending through the region of conductive or semiconductor material, the region of conductive or semiconductor material including first and second walls of the conductive or semiconductor material on opposite sides of the third insulating wall.

16. The method of claim 13, wherein the conductive or semiconductor region extends between and directly contacts the first and second insulation walls from the first surface to the second surface of the semiconductor layer.

17. A device, comprising:

a semiconductor layer having a first surface and a second surface opposite the first surface;

a first insulation layer extending from the first surface of the semiconductor layer past the second surface of the semiconductor layer;

a second insulation layer spaced laterally apart from the first insulation layer, the second insulation layer extending from the first surface of the semiconductor layer past the second surface of the semiconductor layer; and a conductive material between the first insulation layer and the second insulation layer, the conductive material being substantially coplanar with the second surface of the semiconductor layer, the conductive material extending between and directly contacting the first and second insulation walls from the first surface to the second surface of the semiconductor layer.

18. The device of claim 17, further comprising:

a passivation layer on the second surface of the semiconductor layer, the first and second insulation layers, and the conductive material.

* * * * *